United States Patent
Hahn et al.

(10) Patent No.: US 8,380,771 B2
(45) Date of Patent: Feb. 19, 2013

(54) FILTER SHAPING USING A SIGNAL CANCELLATION FUNCTION

(75) Inventors: Wilhelm Steffen Hahn, Los Altos, CA (US); Wei Chen, Newark, CA (US)

(73) Assignee: Quellan, Inc., Santa Clara, CA (US)

( * ) Notice: Subject to any disclaimer, the term of this patent is extended or adjusted under 35 U.S.C. 154(b) by 991 days.

(21) Appl. No.: 12/413,454

(22) Filed: Mar. 27, 2009

(65) Prior Publication Data

US 2010/0244943 A1  Sep. 30, 2010

(51) Int. Cl.
*G06F 17/10* (2006.01)
(52) U.S. Cl. .................................... 708/309; 708/300
(58) Field of Classification Search ........... 708/300–323
See application file for complete search history.

(56) References Cited

U.S. PATENT DOCUMENTS

| | | | |
|---|---|---|---|
| 4,438,504 A * | 3/1984 | Favin | 708/322 |
| 6,091,366 A | 7/2000 | Zhang | |
| 6,307,443 B1 | 10/2001 | Gabara | |
| 6,385,435 B1 | 5/2002 | Lee | |
| 7,035,361 B2 | 4/2006 | Kim | |
| 7,050,388 B2 | 5/2006 | Kim | |
| 7,123,676 B2 | 10/2006 | Gebara | |
| 7,173,551 B2 | 2/2007 | Vrazel | |
| 7,215,721 B2 | 5/2007 | Hietala | |
| 7,366,244 B2 | 4/2008 | Gebara | |
| 8,031,892 B2 * | 10/2011 | Andersen et al. | 381/316 |
| 2003/0025563 A1 | 2/2003 | Christensen | |
| 2003/0048130 A1 | 3/2003 | Isoda | |
| 2004/0213354 A1 | 10/2004 | Jones | |
| 2006/0262880 A1 * | 11/2006 | Mizuta et al. | 375/297 |
| 2007/0060059 A1 | 3/2007 | Kim | |
| 2007/0064923 A1 | 3/2007 | Schmukler | |
| 2007/0262813 A1 | 11/2007 | Li et al. | |
| 2008/0224792 A1 | 9/2008 | Nielsen | |
| 2008/0261543 A1 | 10/2008 | Hara et al. | |
| 2009/0016545 A1 | 1/2009 | Stelliga | |

FOREIGN PATENT DOCUMENTS

EP   1780888   2/2007

* cited by examiner

*Primary Examiner* — Tan V. Mai
(74) *Attorney, Agent, or Firm* — King & Spalding

(57) ABSTRACT

A signal filter and accompanying methods. In one embodiment, the filter includes a first mechanism for receiving a first signal. A second mechanism employs one or more modified representations of the first signal to cancel one or more frequency components of the first signal, yielding an output signal in response thereto. In a more specific embodiment, the first mechanism includes a splitter for receiving the first signal and splitting the first signal onto a first path and a second path. The second mechanism further includes one or more delay modules and one or more phase shifters in the first path and/or the second path. One or more controllable amplifiers are optionally included in the first path and/or the second path. The one or more delay modules, phase shifters, or amplifiers are responsive to one or more control signals from a controller. The controller is adapted to modify behavior of the second mechanism so that the filter is characterized by a desired frequency response.

35 Claims, 13 Drawing Sheets

FILTER SHAPING USING A SIGNAL CANCELLATION FUNCTION

REFERENCE TO RELATED APPLICATIONS

This application is related to U.S. patent application Ser. No. 12/652,281, now U.S. Pat. No. 8,166,084, and filed on Jan. 5, 2010, entitled "CALIBRATION OF ADJUSTABLE FILTERS," which is hereby incorporated by reference as if set forth in this application in full for all purposes.

BACKGROUND OF THE INVENTION

This application relates in general to electronic signal processing systems and more specifically to creating signal filters with desired characteristics.

This application relates in general to electronic signal processing systems and more specifically to creating configurable filters with desired characteristics. This application relates in general to electronic signal processing systems and more specifically to creating configurable filters with desired characteristics.

Filters are used extensively in signal processing systems to modify or shape a signal's frequency components. For example, low pass, high pass, bandpass and other types of filters attempt to attenuate and/or amplify or enhance specific ranges of frequencies in an input signal. Signal filters can be employed in various demanding applications, including cellular telephone transceiver circuits, Global Positioning System (GPS) receivers, Wireless Local Area Network (WLAN) transceivers, Blue Tooth transceivers, sound processing circuits, electronic noise cancellation circuits, analog and digital television tuners (e.g., terrestrial, network, and satellite), satellite and cable radios, WiMAX (Worldwide Interoperability for Microwave Access) transceivers, and so on.

Desired types of filter characteristics may be difficult, expensive, require additional components, or be otherwise problematic to achieve. Thus, it is desirable to provide techniques and systems for implementing filters.

DETAILED DESCRIPTION OF EXAMPLE EMBODIMENTS

Figure 1:
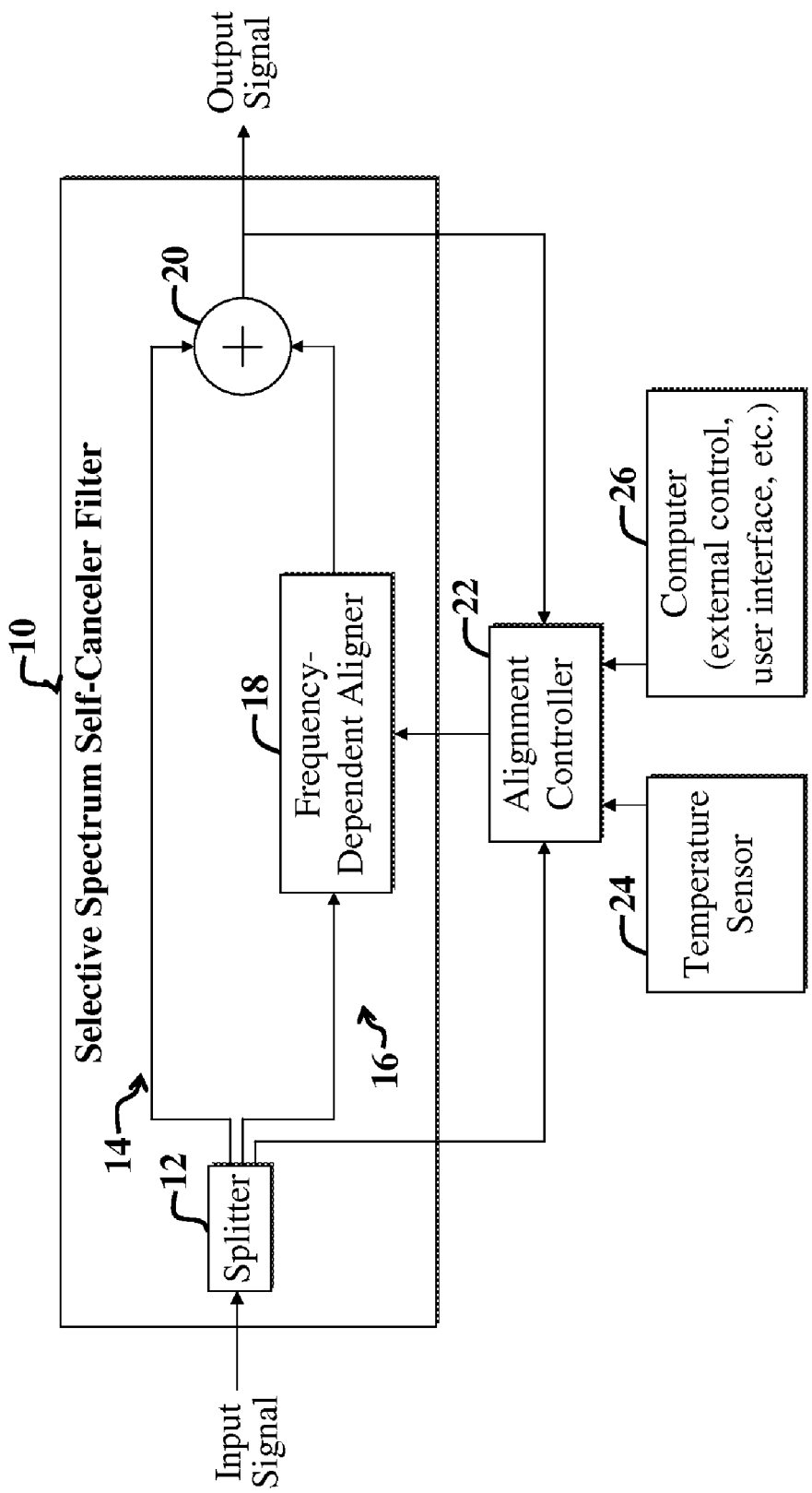
FIG. 1 illustrates a first example of selective spectrum self-canceler filter capable of wide ranging adjustments of the accompanying filter frequency response.

An example adjustable filter includes a first mechanism for receiving a first signal. A second mechanism employs one or more modified representations of the first signal to cancel, suppress, or reduce one or more frequency components of the first signal, yielding an output signal in response thereto.

In a more specific embodiment, the first mechanism includes a splitter for receiving the first signal and splitting the first signal onto a first path and a second path. The second mechanism further includes one or more delay modules and one or more phase shifters in the first path and/or the second path. One or more controllable amplifiers are additionally included in the first path and/or the second path or may be merged into the splitter or other block.

In another embodiment, one or more delay modules, phase shifters, or amplifiers are responsive to one or more control signals from a controller, called an alignment controller. The alignment controller may include a local reference oscillator to facilitate selectively controlling the one or more controllable amplifiers, phase shifters, or delay modules in the first path and/or the second path. The alignment controller is adapted to modify the behavior of the second mechanism so that filter is characterized by a desired frequency response. In this embodiment, the filter implements a controllable notch filter that is controllable, in part, via one or more controllable Variable Gain Amplifiers ("VGAs," also including voltage controlled amplifiers (VCAs), mixers, etc.) included in the second mechanism. A suitable VGA might be implemented with a mixer like structure, but other suitable implementations are possible. The one or more controllable VGAs affect alignment of a modified representation of the first signal relative to the first signal so that when the modified representation of the first signal on the second path is combined with the first signal on the first path, the resulting output signal exhibits desired spectral characteristics.

In an illustrative embodiment, the filter is a notch filter that is implemented in a combined filter. The combined filter includes one or more instances of the notch filter and a second filter. A transfer function of the combined filter is characterized by an asymmetrical frequency response curve.

Note that a given notch sub-filter of a combined filter may be characterized by an asymmetrical frequency response. Use of notch sub-filters with asymmetrical frequency responses may significantly reduce the number of sub-filters needed to obtain a desired combined frequency response, e.g., to selectively shape, attenuate, or cut the left or right side of a frequency response of the overall filter as desired.

In a more specific implementation, the second filter includes a bandpass filter. A controller is coupled to the one or more instances of the notch filter. The controller includes instructions for calibrating the combined filter to yield a combined desired transfer function or frequency response based on one or more predetermined inputs, such as a temperature input, to the controller. Other example inputs include supply voltage, process corner, and channel number.

The novelty of certain embodiments discussed herein is facilitated by use of a signal or version thereof to selectively cancel certain portions or frequency components of the signal by selectively adjusting and temporally aligning the signal with a version of the signal. The filter may implement frequency-dependent subtraction or cancellation of desired spectral components of an input signal. Accordingly, the filter is also called a selective spectrum self-canceler filter. For the purposes of the present discussion, a selective spectrum self-canceler filter may be any filter that employs one or more portions or versions of a signal to selectively cancel one or more portions, such as frequency components, of the same signal.

Use of a self-cancellation mechanism, such as the second mechanism discussed above, enables the frequency response characteristics of the filter to be radically adjusted by simply changing the way one portion of a signal is shifted, delayed, and amplified before it is combined with the original signal. Such modifications, which may include increasing or decreasing the Quality factor (Q) of a filter, may readily be performed by controlling VGAs in phase shifting modules and/or by controlling circuit component values, such as the capacitance or inductance of a voltage controlled capacitor (varactor), switched-capacitor array (also called a switched-capacitor bank), or, e.g., the current in a controllable inductor, as discussed more fully below.

Certain embodiments discussed herein may exhibit a highly controllable notched transfer function or frequency response, such that when notched transfer function is combined with other filters and transfer functions, the resulting combined transfer function or frequency response exhibits excellent controllability. Such controllability is particularly effective in designing adaptive filters whose transfer functions may be adjusted to meet the needs of changing signal environments without the need to use additional switches or filters. Furthermore, noise or other interfering signals which are close to the frequency band of a desired signal and that are often difficult to remove with conventional filters, may be readily removed via filters with asymmetrical frequency responses implemented in accordance with the present teachings.

While certain embodiments are discussed herein with respect to methods for creating a notch filter, those skilled in the art may readily adapt certain embodiments to create other types of filters without departing from the scope of the present teachings.

For clarity, certain well-known components, such as power supplies, local oscillators, mixers, clocks, digital-to-analog converters, analog-to-digital converters, detectors, and so on, have been omitted from the figures. However, those skilled in the art with access to the present teachings will know which components to implement and how to implement them to meet the needs of a given application.

FIG. 1 illustrates a first example of selective spectrum self-canceler filter 10 capable of significant adjustments to the accompanying filter frequency response. For the purposes of the present discussion, the frequency response of a filter represents the behavior of a filter or the effects that a filter has on a given input signal as a function of frequency. A frequency response may be represented via a curve or mathematical representation of the behavior of the filter with respect to frequency. The frequency response may also refer to a graphical depiction of a transfer function of a filter. For the purposes of the present discussion, a transfer function of a filter may be any mathematical representation of filter behavior.

The selective spectrum self-canceler filter 10 is also called a canceler filter herein. The canceler filter 10 includes a splitter 12, which splits an input signal onto a first path 14 and a second path 16. The second path 16 is called the canceler path. The canceler path 16 includes a frequency-dependent aligner 18 coupled between the splitter 12 and an output adder 20. The output adder 20 may also be called a signal combiner 20.

In the present specific embodiment, the first path 14 is input directly to the output adder 20. An output of the adder 20 represents the output of the filter 10. Note that while the first path 14 is shown directly coupling an output of the splitter 12 to an input of the output adder 20, other circuit components may be included in the first path 14 without departing from the scope of the present teachings. The splitter 12 may be implemented via one or more various well known components, such as passive resistors, capacitors, active splitters, transformers, and so on.

A controller 22 receives input from an output of the splitter 12 and an output of the output adder 20 and provides control input to the frequency-dependent aligner 18. The controller 22 optionally receives input from a temperature sensor 24 and a computer 26. The computer 26 may provide external control signals to the controller 22 to facilitate controlling the controller 22 and accompanying canceler filter 10. The computer 26 may include control software and a user interface for facilitating configuring the controller 22 and accompanying filter 10. The alignment controller 22 may include a local reference oscillator to facilitate adjusting the frequency-dependent aligner 18. Other example inputs to the alignment controller may include supply voltage, process corner, channel number, and so on.

In operation, the splitter 12 splits an input signal into a first signal traveling on the first path 14 and a second signal travelling on the second path 16. The first signal is representative of the signal input to the splitter 12. The second signal is selectively modified by the frequency dependent aligner 18 so that when the resulting modified second signal is combined with the first signal via the output adder 20, the resulting output signal exhibits desired spectral characteristics. The modified second signal is selectively modified so that the filter 10 exhibits a desired transfer function and accompanying frequency response. The signal-dependent aligner 18 in combination with the output adder 20 is said to implement a signal-cancellation function, whereby desired components in the input signal are cancelled, resulting in an output signal with desired frequencies cancelled or suppressed.

In one implementation, the frequency-dependent aligner 18 modifies a predetermined spectral component of the second signal, such as by delaying a predetermined frequency band and then phase shifting the entire signal, so that when the output adder 20 combines the modified second signal with the first signal, it implements frequency-dependent subtraction. Portions of the modified second signal destructively couple or add, effectuating signal subtraction or cancellation, resulting in an output signal with desired frequency components thereof suppressed or cancelled.

For the purposes of the present discussion, a frequency component of a signal is also called a spectral component of a signal. A spectral component of a signal may be any portion of the signal characterized by a particular frequency or range of frequencies. For example, a certain signal may include various sinusoidal signals of different frequencies coupled together in one signal. Each sinusoidal signal of a given frequency may be considered a spectral component of the signal into which the sinusoidal signal is combined. Note that generally, many signals of practical interest may be decomposed into a sum of sinusoidal signal components. For periodic signals, such a decomposition is known in the art as a Fourier series.

For the purposes of the present discussion, a frequency dependent aligner may be any module that is adapted to selectively modify a first signal and then temporally align the first signal relative to a second signal. A first signal is said to be aligned with the second signal if the first signal and second signal are characterized by amplitudes at particular times such that a combination of the first signal with the second signal at the particular times results in desired complete or partial cancellation of a portion of the first signal or the second signal. Hence, alignment may be considered a type of misalignment to result in the selective destructive combination of a first signal with a second signal.

The controller 22 includes one or more routines or instructions for adjusting the frequency dependent aligner 18, such as by controlling VGA multiplication values, varactor capacitance, switched-capacitor array capacitance values, and so on, to selectively adjust the transfer function or frequency response of the filter 10. The controller 22 may receive feedback from the filter 10 via the output of the filter 10, and may compare it with the input to the filter 10 to determine how modifications to the frequency dependent aligner 18 affect the frequency response of the filter 10.

The controller 22 may also include a pilot tone generator, such as a voltage controlled oscillator, for inputting desired test signals (characterized by the pilot tone or frequency) into the filter 10 to test the response of the filter 10. The controller 22 may also include instructions for adjusting the frequency response of the filter 10 based on temperature sensed by the temperature sensor 24 and/or based on other inputs. Since filter behavior may be affected by temperature, filter adjustments in response to certain temperature changes may be desirable.

In one implementation, the controller 22 may include a Look-Up Table (LUT) that stores parameters to be used for certain components of the frequency dependent aligner 18. Different sets of parameters may be associated with different temperatures. When the temperature changes by a predetermined threshold, a different set of parameters, as specified in the LUT, may be input from the controller 22 to the frequency dependent aligner 18 to make appropriate adjustments to the frequency response of the filter 10.

The controller 22 may be used to initially calibrate the filter 10 for a predetermined application. The controller 22 may also be used to dynamically change the frequency response of the filter 10 based on changing signal environments, such as, for example, in response to the detection of a given interference signal; in response to a predetermined signal level or amplitude detected at the input of the filter 10; in response to a signal indicating a channel has been changed in the accompanying device, or a particular adjacent antenna has been activated, and so on. Those skilled in the art may incorporate additional detectors, signal inputs, and so on, and may configure the control algorithms of the controller 22 appropriately to meet the needs of a given implementation without undue experimentation.

Examples of suitable control algorithms, filter-calibration methods, and accompanying systems are discussed more fully in the co-pending U.S. patent application referenced above.

The computer 26, which may be implemented, for example, by a cellular telephone baseband processor, firmware, or other devices, may implement a mechanism to facilitate controlling the controller 22. In certain implementations, the computer 26 may include a user interface to allow user adjustments of the transfer function of the filter 10 by enabling adjustments to circuit component parameters included in the frequency dependent aligner 18.

Figure 2:
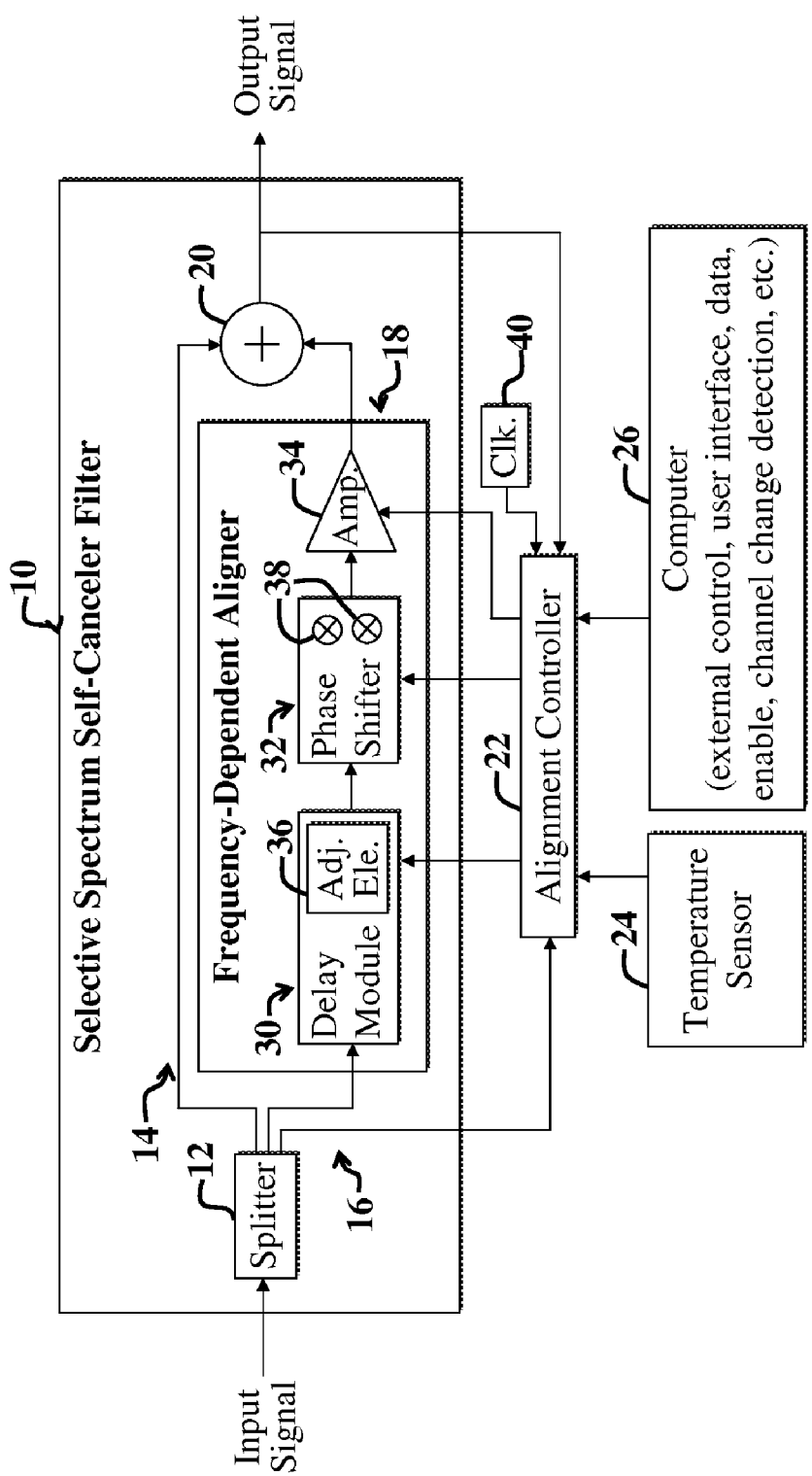
FIG. 2 is a more detailed diagram of the selective spectrum self-canceler filter of FIG. 1.

FIG. 2 is a more detailed diagram of the selective spectrum self-canceler filter 10 of FIG. 1. The frequency dependent aligner 18 is shown including a controllable delay module 30 coupled to a controllable phase shifter 32. An output of the controllable phase shifter 32 is coupled to a controllable amplifier 34. An input to the controllable delay module 30 is coupled to an output of the splitter 12. An output of the controllable amplifier 34 is coupled to an input of the output adder 20.

The controllable delay module 30 includes controllable components 36, which may be variable resistors, voltage-controlled capacitors and inductors, and so on. The values of the circuit components may be selectively set by one or more control signals from the controller 22. The exact implementation of the control signals, such as the number of bits to use; whether pulse code modulation is used; whether Direct Current (DC) offsets are used, and so on, are application specific. Those skilled in the art with access to the present teachings may implement a controller to meet the needs of a given application without undue experimentation.

The various controllable components 36 of the delay module 30 may be adjusted to affect which frequency components of the second signal on the second path 16 are delayed and by what amount. Note that the delay module 30 acts to selectively delay one or more spectral components of the second signal traveling along the second path 16 relative to the first signal travelling along the first path 14. The Quality factor (Q) of the filter 10 may be adjusted by controlling the delay imparted by the delay module 30. Generally, larger delays are obtained from a larger Q, and smaller delays are obtained from a smaller Q. Adjusting the Q of the filter 10 will typically make the resulting notched frequency response narrower or wider. Wider notches are associated with lower Qs and have a shallower depth, whereas smaller notches are associated with higher Qs and are usually deeper.

Those skilled in the art will appreciate that the delay module 30 may be implemented via a delay line, allpass filter, or a high Q (Quality factor) bandpass filter, called a Q-enhancer. Suitable delay modules for a particular application may be readily implemented by those skilled in the art with access to the present teachings without undue experimentation.

The delay module 30 outputs a signal with selectively delayed spectral components to the phase shifter 32. The phase shifter 32 then temporally shifts the resulting signal by a predetermined phase angle, thereby selectively aligning the second signal with the first signal to result in desired destructive signal canceling in the output adder 20.

The phase shifter 32 may be implemented via a conventional phase shifter, but with controllable VGAs 38 used in place of conventional fixed mixers or amplifiers therein. The controllable VGAs may be implemented via mixers or via other components without departing from the scope of the present teachings. Alternatively, the phase shifter 32 and accompanying amplifier 34 may be replaced with an (In phase/Quadrature) IQ modulator or quadrature modulator, as discussed more fully below. Suitable controllable VGAs may be readily developed or obtained by those skilled in the art without undue effort.

By selectively controlling the VGAs 38 of the phase shifter 32 and the circuit components 36 of the delay module 30, the filter 10 may be tuned to exhibit a wide variety of transfer functions or frequency responses. Use of the canceler path 16 and accompanying frequency dependent aligner 18 enables drastic changes to the filter transfer function and frequency response that are not currently obtainable via conventional filters. Such controllability is particularly useful in noise-canceling applications in crowded signal environments, such as mobile computing applications involving mobile television, Global Positioning System (GPS) and WiFi (Wireless Fidelity) or Wi-MAX (Worldwide Interoperability for Microwave Access) features. However, uses of the filter 10 are not limited to such applications.

The controllable amplifier 34 then amplifies the resulting delayed and phase-shifted signal output by the phase shifter 32 by a predetermined factor, the factor of which depends on the desired transfer function of the filter 10.

The controller 22 is adapted to control the behavior of the delay module 30, phase shifter 32, and amplifier 34 by setting circuit-component values (e.g., of the components 36) thereof and/or by adjusting one or more VGAs (e.g., of the VGAs 38) thereof, and/or by controlling DC offsets or other parameters. For illustrative purposes, the controller 22 is shown receiving a clock input from a clock 40 for an accompanying circuit. Note that in digital implementations of the controller 22, a clock signal will be used by the controller to synchronize its internal circuits. Additional inputs, such as inputs indicating voltage changes (ΔV) or channel changes in accompanying circuits that might affect the desired filter transfer function, and other external inputs, such as enable signals (En), data signals (Data), and so on, may be input to the controller 22 for use by the accompanying control algorithm. Exact details of the control algorithm are application specific and may vary depending on the implementation.

Note that various additional or fewer components may be added to or removed from the filter 10 without departing from the scope of the present teachings. For example, a local oscillator may be employed to sample the analog output signal from the output adder 20 for input to the controller 22, and digital-to-analog converters may be positioned at outputs of the controller 22. Furthermore, in certain implementations, the amplifier 34 may be omitted. In addition, the delay module 30 and/or the phase shifter 32 may be implemented on separate paths, such that, for example, the delay module 30 is positioned in the first path 14, and the phase shifter 32 is positioned in the second path 16. Furthermore, while the filter 10 is shown implemented for analog applications, digital implementations of the filter 10 may be constructed without departing from the scope of the present teachings.

Figure 3:
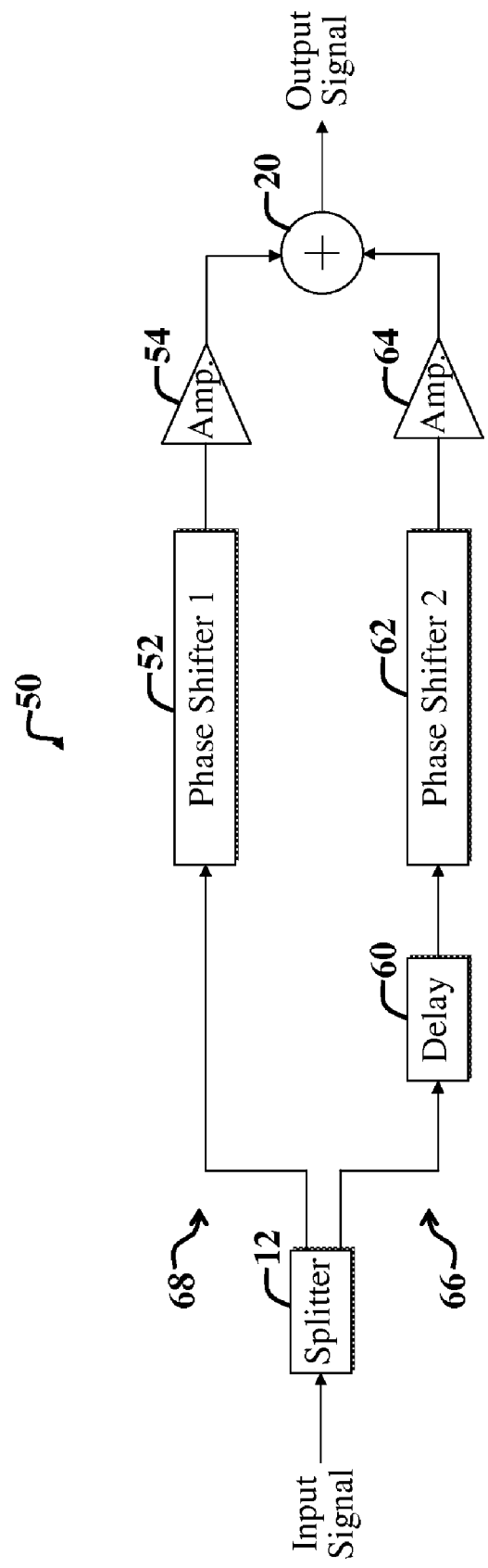
FIG. 3 illustrates a second example embodiment of a selective spectrum self-canceler filter.

FIG. 3 illustrates a second example embodiment of a first alternative selective spectrum self-canceler filter 50. The alternative filter 50 includes the splitter 12, which splits an input signal onto a top path 68 and a bottom path 66. The top path 68 includes a first phase shifter 52 coupled to a first amplifier 54, an output of which is input to the output adder 20. The second path includes a first delay module 60 coupled to a second phase shifter 62, which is coupled to a second amplifier 64. An output of the second amplifier 64 is input to the output adder 20.

The principle of operation of the alternative filter 50 is similar to the principle of operation of the filter 10 of FIGS. 1-2 with the exception that, for illustrative purposes, the alternative filter 50 is shown lacking a controller, and both the signal traveling on the first path 68 and the signal traveling on the second path 66 are selectively modified before being combined via the output adder 20.

The present alternative filter 50 represents an example static implementation, where no control over the filter's performance is needed. Design parameters of the various modules 52, 54, and 60-64 are chosen so that the signal output by the second amplifier 64 selectively combines with the output of the first amplifier 54 in the output adder 20 so that desired spectral components cancel each other, yielding a desired output signal from the output adder 20. Design parameters and circuit configurations of various modules 52, 54, and 60-64 are chosen to result in a desired frequency response of the filter 50.

Note that while FIG. 3 shows the splitter 12 splitting an input signal onto an upper path with the first phase shifter 52 and amplifier 54 and onto a lower path with a delay module 60, second phase shifter 62, and second amplifier 64, the various modules 52, 54, 60, 62, 64 may be positioned on different paths than shown, and certain modules may be omitted. For example, the first phase shifter 52 and amplifier 54 may be omitted from the upper path. Alternatively, the delay 60 may be positioned on the upper path. Alternatively, the second phase shifter 62 and amplifier 64 may be removed from the lower path. Note that additional variations other than those discussed here are also possible, e.g., one or more of the amplifiers 54, 64 may be omitted, and so on. In addition, the adjustable filter 10 may be made more complex or may be nested in another adjustable filter constructed according to the present teachings.

Figure 4:
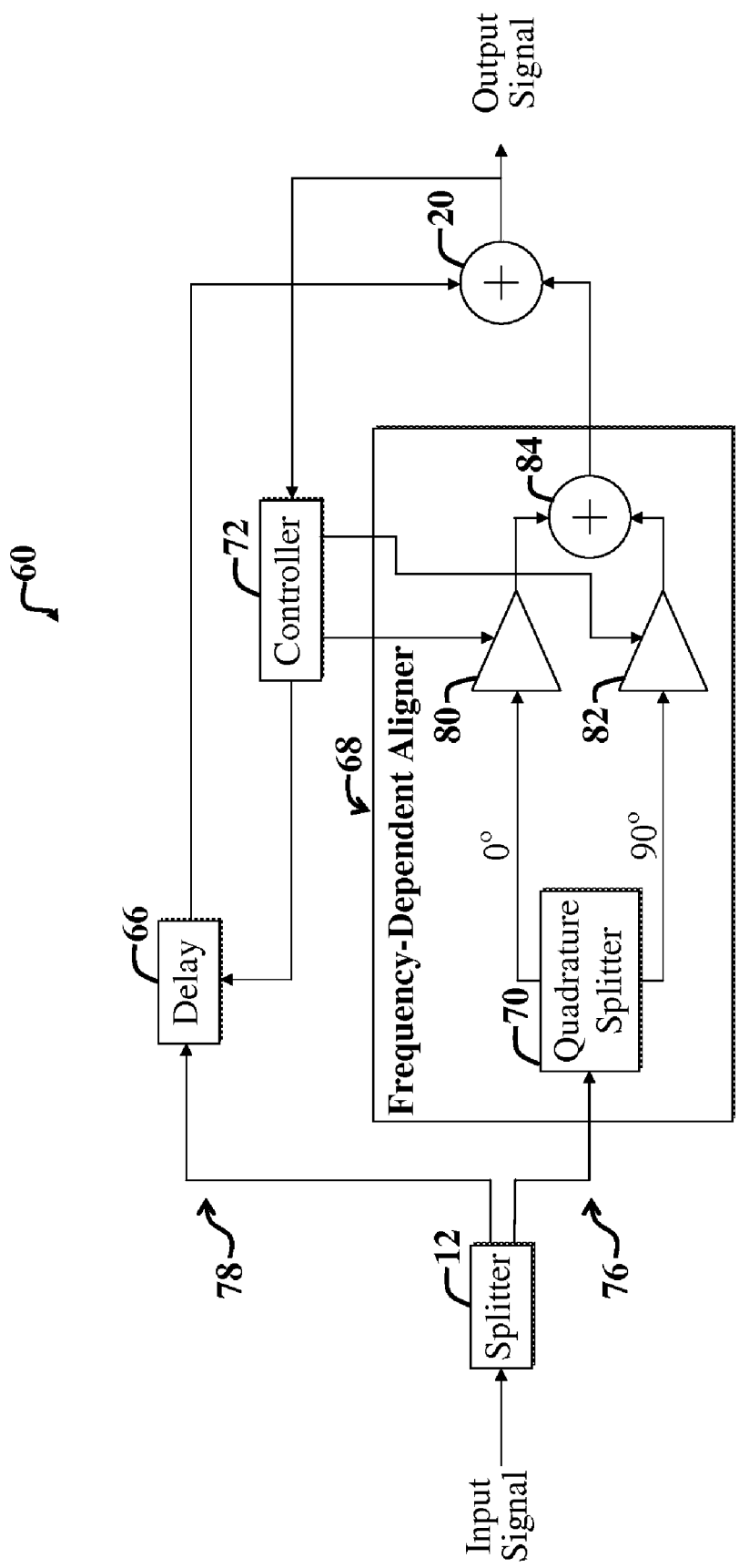
FIG. 4 illustrates a third example embodiment of a selective spectrum self-canceler filter.

FIG. 4 illustrates a third example embodiment of a second alternative selective spectrum self-canceler filter 60. The second alternative filter 60 includes the splitter 12 at the input of the filter 60. The splitter 12 splits the input signal onto an upper path 78 and a lower path 76. The upper path includes a delay module 66 for selectively delaying a desired frequency component of the signal on the upper path 78. The lower path includes an IQ modulator 68 for selectively phase shifting and amplifying the signal on the lower path so that the resulting signals from the upper path 78 and lower path 76 combine at the output adder 20, yielding an output signal with desired spectral characteristics.

For illustrative purposes, the IQ modulator 68 is shown including a quadrature splitter 70, which splits a signal output by the splitter 12 and delivered to the lower path 76 into two separate signals, including an In-phase (I) signal and a Quadrature (Q) signal, that are approximately ninety degrees out of phase. The signals (I, Q) output from the quadrature splitter 70 are said to be in quadrature. The quadrature splitter 70 may be implemented via various types of circuits, such as an LC, RC, LR, capacitive only, allpass, or polyphase filter.

The (I) signal is input to a first controllable amplifier 80, and the (Q) signal is input to a second controllable amplifier 82, the outputs of which are added via a summation circuit 84, yielding a phase-shifted and amplified signal as output. The resulting phase-shifted and amplified signal is input to one terminal of the output adder 20. Another terminal of the output adder 20 is coupled to an output of the upper-path delay module 66.

The behaviors of the upper-path delay module 66 and the amplifiers 80, 82 of the IQ modulator 68 are adjustable via controls signals output from an alternative controller 72. Adjustments made to the delay module 66 and the IQ modulator 68 result in changes to the transfer function of the filter 60. The adjustable amplifiers 80, 82 may be implemented via voltage controlled analog amplifiers, digitally controlled switch type amplifiers, or other suitable controllable amplifiers. Note that one or more of the amplifiers 80, 82 or the upper-path delay module 66 may be non-controllable without departing from the scope of the present teachings.

In general, the second alternative filter 60 operates on a similar principle as the filters 10, 50 of FIGS. 1-3, whereby signal cancellation or selective destructive or constructive combining one or more modified versions of a signal is used to yield an output signal with desired spectral characteristics in accordance with a desired filter frequency response.

Figure 5:
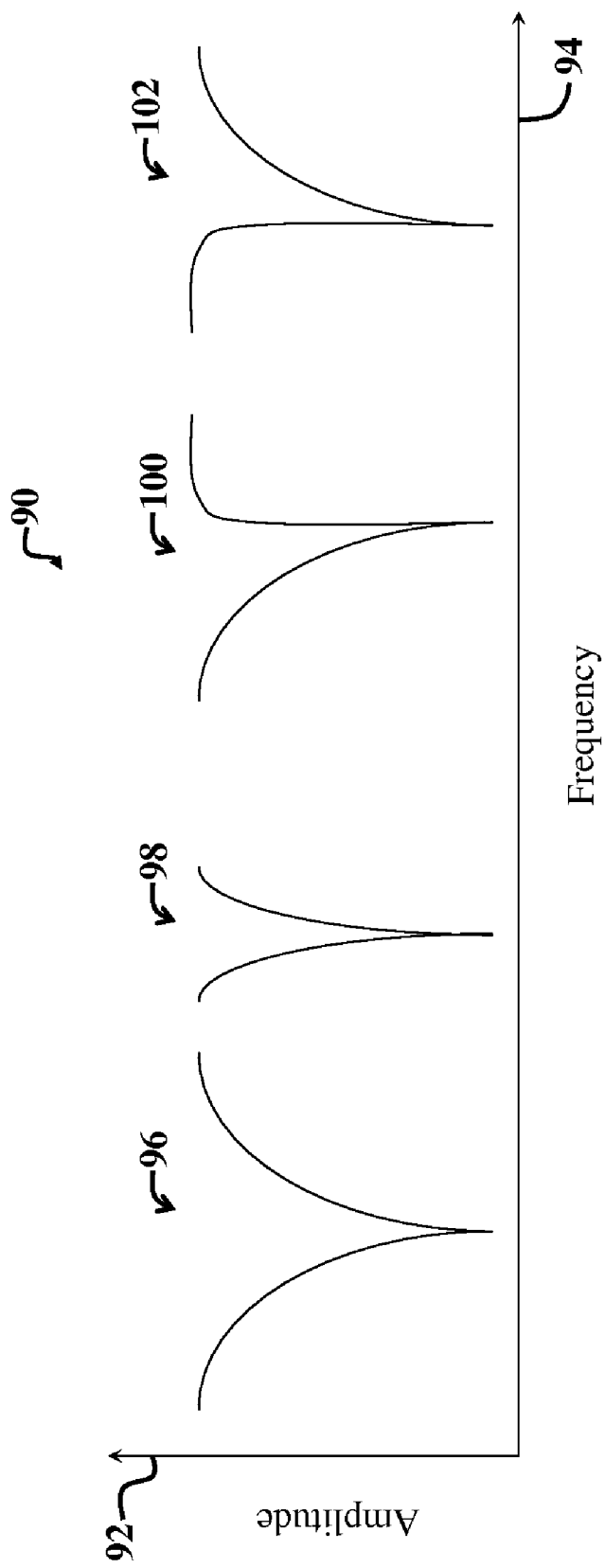
FIG. 5 is a graph depicting example frequency responses of the selective-spectrum self-canceler filters of FIGS. 1-4.

FIG. 5 is a graph depicting example frequency responses 90 of the selective-spectrum self-canceler filters 10, 50, 60 of FIGS. 1-4. The example frequency responses 90 are plotted as a function of amplitude 92 versus frequency 94. The example frequency responses 90 include a first notch 96, a second notch 98, a third notch 100, and a fourth notch 102. The first notch 96 illustrates a low quality factor Q and a lower center frequency than the other notches 98-102. The second notch 98 illustrates larger quality factor than the first notch 96. The third notch 100 is asymmetrical with a relatively steep right side, while the fourth notch 102 is asymmetrical with a relatively steep left side.

The various frequency response curves 96-102 are merely illustrative of some frequency response curves that may be obtained via one or more filters constructed in accordance with one or more embodiments discussed herein. Filters with such frequency responses may be selectively combined with other types of filters, such as low pass, high pass, bandpass, or allpass filters to achieve a desired combined transfer function, as discussed more fully below. For example, a filter characterized by the fourth frequency response curve 102 may be used with a bandpass filter to suppress blockers or transmitters near the upper end of the passband of the filter.

Figure 6:
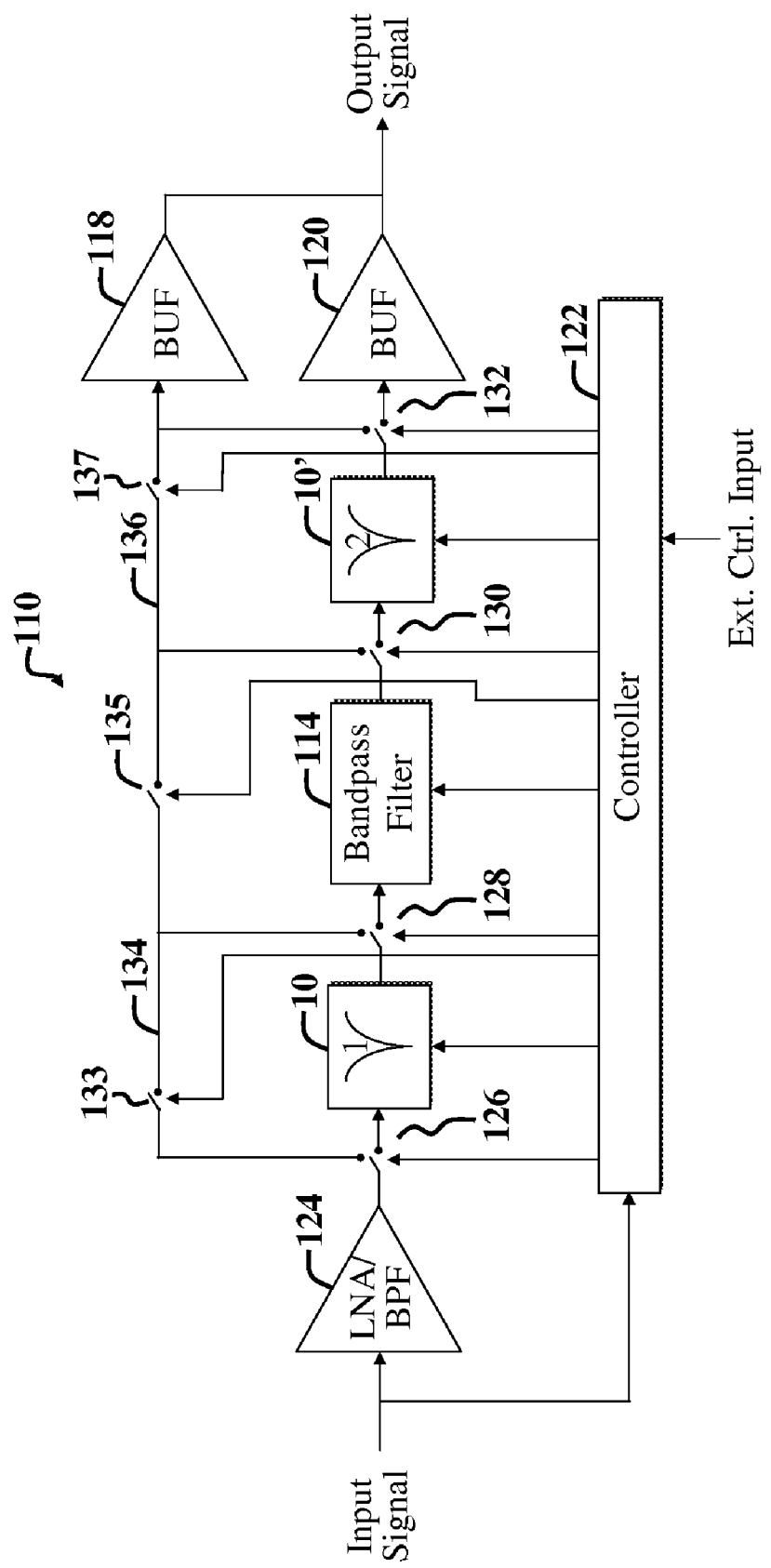
FIG. 6 is a diagram of a fourth example adjustable filter incorporating instances of the first example selective spectrum self-canceler filter of FIGS. 1-2.

FIG. 6 is a diagram of a fourth example adjustable filter 110 incorporating a first instance 10 and a second instance 10' of the first example selective spectrum self-canceler filter 10 of FIGS. 1-2. The example adjustable filter 110 represents a combined filter, which includes canceler filters 10, 10' and a bandpass filter 114 coupled therebetween. The combined filter 110 includes an input Low Noise Amplifier (LNA) with an integrated bandpass filter (BPF), which is labeled LNA/BPF 124.

In the present specific embodiment, the LNA 124 is coupled to the first canceler filter 10 via a first single pole double throw controllable switch 126. An output of the first canceler filter 10 is coupled to an input of the bandpass filter 114 via a second single pole double throw switch 128. An output of the bandpass filter 114 is coupled to the second canceler filter 10' via a third single pole double pole switch 130. An output of the second canceler filter 10' is coupled to an input of an output buffer 120 via a fourth single pole double throw switch 132. Second output poles of the first controllable switch 126 and the second controllable switch 128 are coupled to an input and an output, respectively, of a fifth switch 133. The output of the fifth switch 133 represents a first node 134 that connects an output of fifth switch 133, an input of a sixth switch 135, and a second output pole of the second controllable switch 128.

Similarly, second output poles of the third controllable switch 130 and the fourth controllable switch 132 are coupled to an input and an output, respectively, of a seventh switch 137. The input of the seventh switch 137 represents a second node that connects the input of the seventh switch 137, an output of the sixth switch 135, and a second output pole of the third controllable switch 130.

Note that the fifth switch 133, the sixth switch 135, and the seventh switch 137 are controllable switches, which receive control input from a controller 122. These switches 133, 135, 137 may be implemented via a single switch without departing from the scope of the present teachings.

The output of the seventh switch 137 is coupled to an input of a second output buffer 118. The controller 122 receives input from the input of the LNA 124; receives input from the output of the filter 110; and provides control signals to the switches 126-132, 133, 135, 137, the canceler filters 10, 10', and the bandpass filter 114.

In operation, the controller 122 initially calibrates parameters of the various filters 10, 10', 114 by employing the switches 126-132, 133, 135, 137 to selectively switch the different sub-filters 10, 10', 114 into and out of the combined filter 110. Use of the switches 126-132, 133, 135, 137 enables algorithms running on the controller 122 to calibrate each of the sub-filters 10, 10', 114 individually and to then calibrate the entire filter 110. Additional details of a suitable calibration algorithm are discussed more fully in the above-identified co-pending U.S. patent application Ser. No. 12/652,281, entitled "CALIBRATION OF ADJUSTABLE FILTERS," the teachings of which are incorporated by reference herein.

The canceler filters 10, 10' act as notch filters and are used to selectively notch the frequency response of the bandpass filter 114 at desired frequencies, thereby creating a desired asymmetrical frequency response of the overall filter 110, as discussed more fully below.

Figure 7:
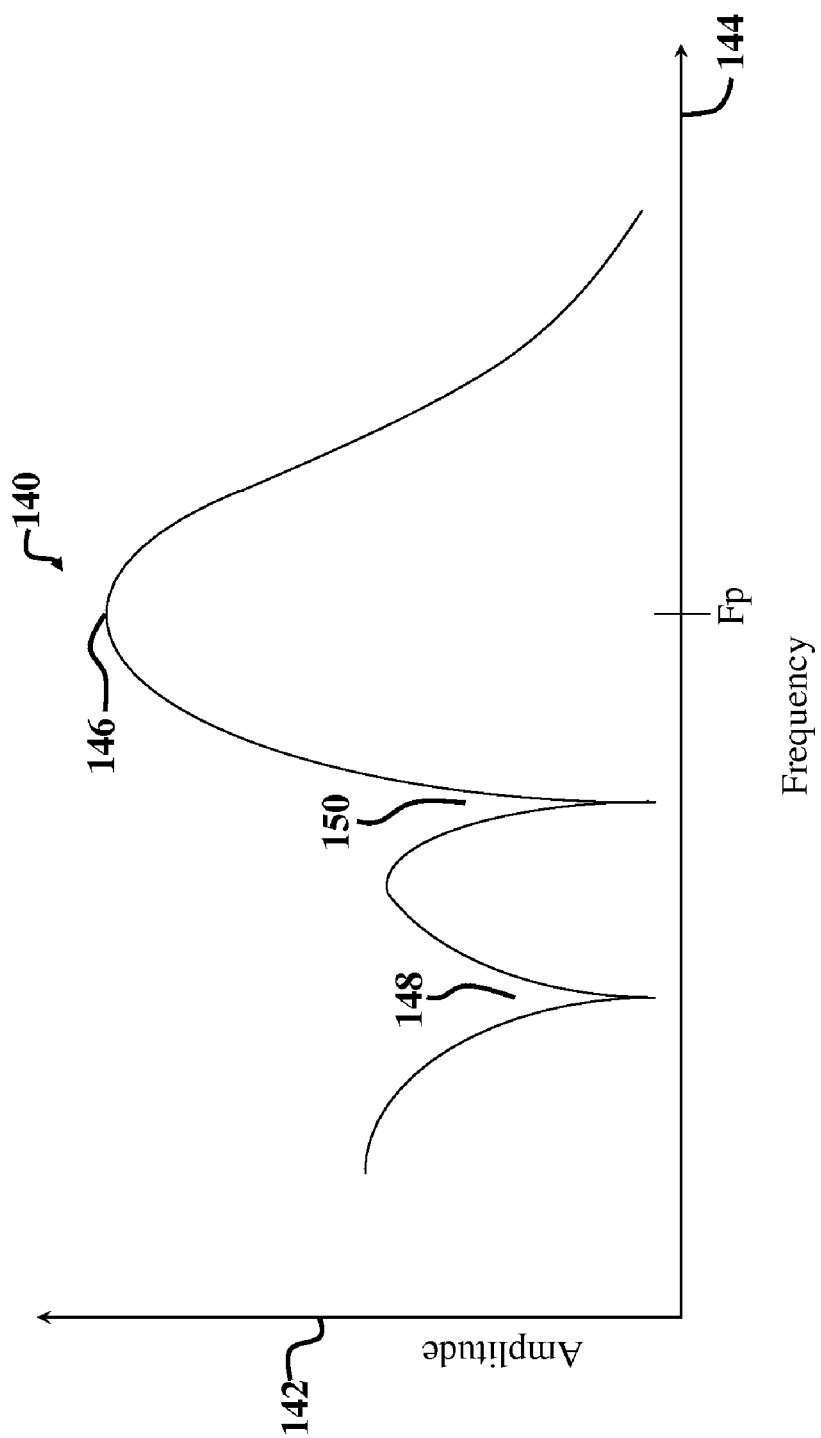
FIG. 7 is a first example frequency response of the adjustable filter of FIG. 6.

FIG. 7 is a first example frequency response 140 of the combined adjustable filter 110 of FIG. 6. The frequency response 140 is plotted as signal amplitude 142 versus frequency 144.

With reference to FIGS. 6 and 7, the frequency response 140 includes a peak 146 corresponding to the center frequency (Fpeak) of the passband of the bandpass filter 114. For illustrative purposes, the first canceler filter 10 is tuned to produce a first notch 148, and the second canceler filter 10' is tuned to produce a second notch 150, which are positioned left of the peak response 146. The notches 148, 150 may be used, for example, to filter noise or interference signals occurring close to the frequency of the desired signal (Fpeak).

Note that conventionally, to create the frequency response 140 would require substantially more hardware, such as filters and sub-filters, than the combined filter 110 of FIG. 6. Furthermore, unlike the combined filter 110 of FIG. 6, existing filters for creating desired frequency responses, especially strategically asymmetrical frequency responses, are not widely controllable.

Figure 8:
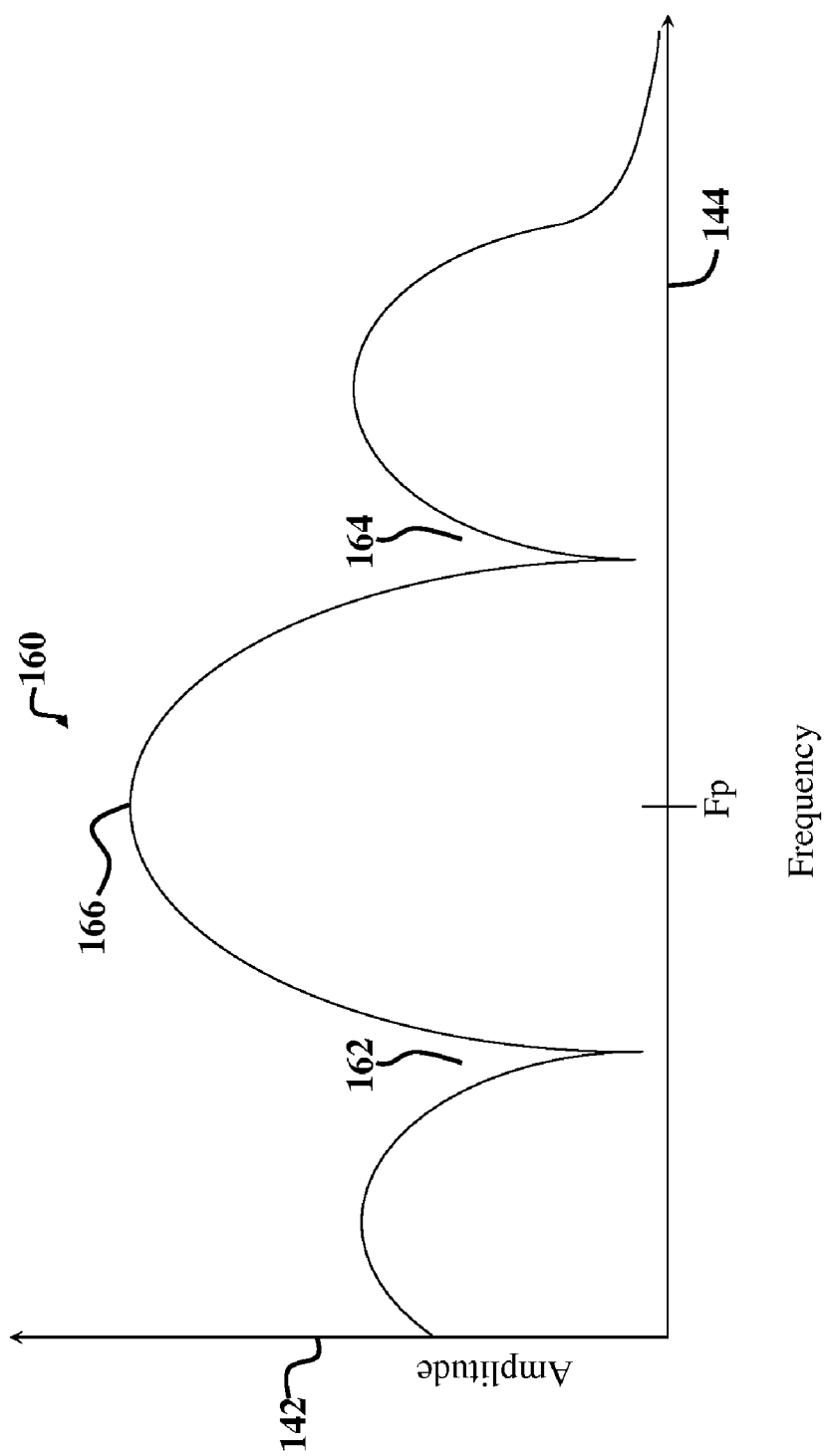
FIG. 8 is a second example frequency response of the adjustable filter of FIG. 6.

FIG. 8 is a second example frequency response 160 of the combined adjustable filter 110 of FIG. 6. The second example frequency response 160, which is plotted as amplitude 142 versus frequency 144, includes a first asymmetrical notch 162 positioned to the left of the peak frequency response 166, and a second asymmetrical notch 164 occurring to the right of the peak frequency response 164.

With reference to FIGS. 6 and 8, the notches 162, 164 may be selectively created and positioned in the overall frequency response 160 by selectively tuning the first canceler filter 10 and the second canceler filter 10'. Accordingly, the canceler filters 10, 10' may be employed to shape the overall filter frequency response 160 as desired for a particular application.

Figure 9:
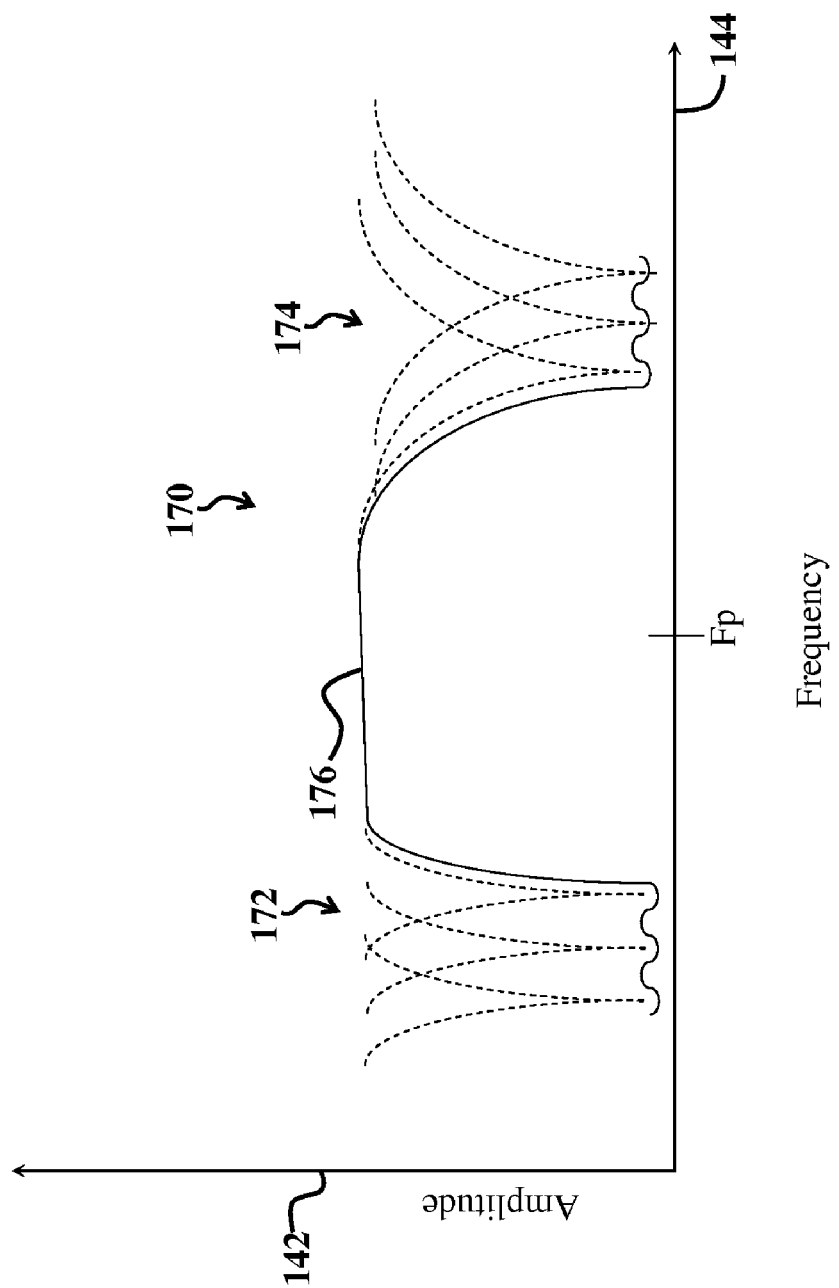
FIG. 9 is a third example frequency response of an adjustable filter incorporating several selective spectrum self-canceler filters to create a desired frequency response.

FIG. 9 is a third example frequency response of an adjustable filter incorporating several selective spectrum self-canceler filters, such as instances of the canceler filter 10 of FIGS. 1-2, to create a desired frequency response. The frequency response 170 depicts use of multiple notches 172 to the left of the peak frequency 176 of a bandpass filter response, and further depicts use of multiple notches 174 to the right of the peak frequency 176. The notches 172-174 are used to shape the overall frequency response 170 as desired. Those skilled in the art with access to the present teachings may readily implement a combined filter to yield the box-like frequency response 170 shown in FIG. 9 without undue experimentation.

Figure 10:
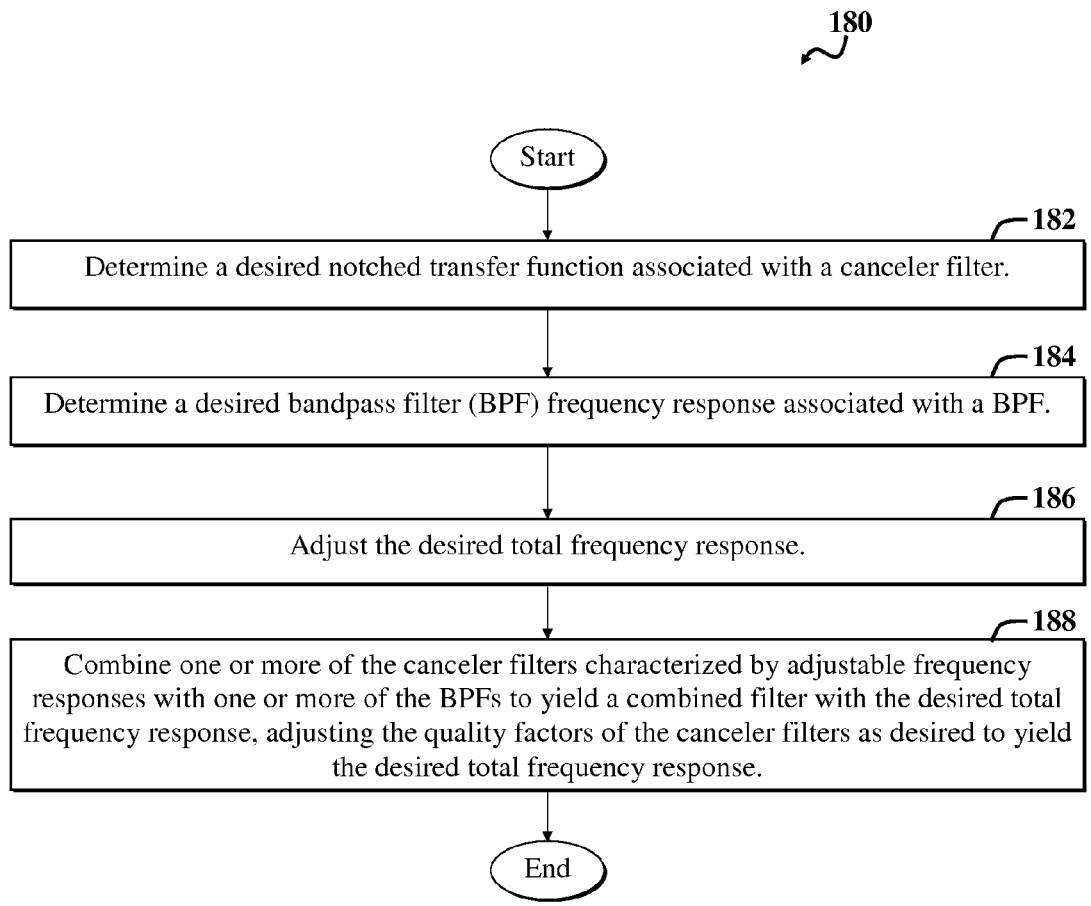
FIG. 10 is a flow diagram of a first example method for making the adjustable filter of FIG. 6.

FIG. 10 is a flow diagram of a first example method 180 adapted for making the adjustable filter 110 of FIG. 6.

The first example method 180 includes a first step 182, which includes determining a first notch frequency response. The first notch frequency response may correspond to the frequency response of a canceler filter, such as the canceler filter 10 of FIG. 1. Note that the canceler filter 10 of FIG. 1 is also called a selective spectrum self-canceler filter.

A second step 184 includes determining a first bandpass frequency response. The bandpass frequency response may be analogous to the frequency response of the bandpass filter 114 of FIG. 6.

A third step 186 includes determining or adjusting a desired total frequency response. Examples of total frequency responses are shown in FIGS. 7-9.

A fourth step 188 includes selectively combining one or more controllable notch filters characterized by one or more versions of the first notch frequency response with one or more bandpass filters characterized by one or more versions of the bandpass frequency response to yield a combined filter, such as the filter 110 of FIG. 6, characterized by a version of the desired total frequency response, such as the frequency response 140 of FIG. 7.

Figure 11:
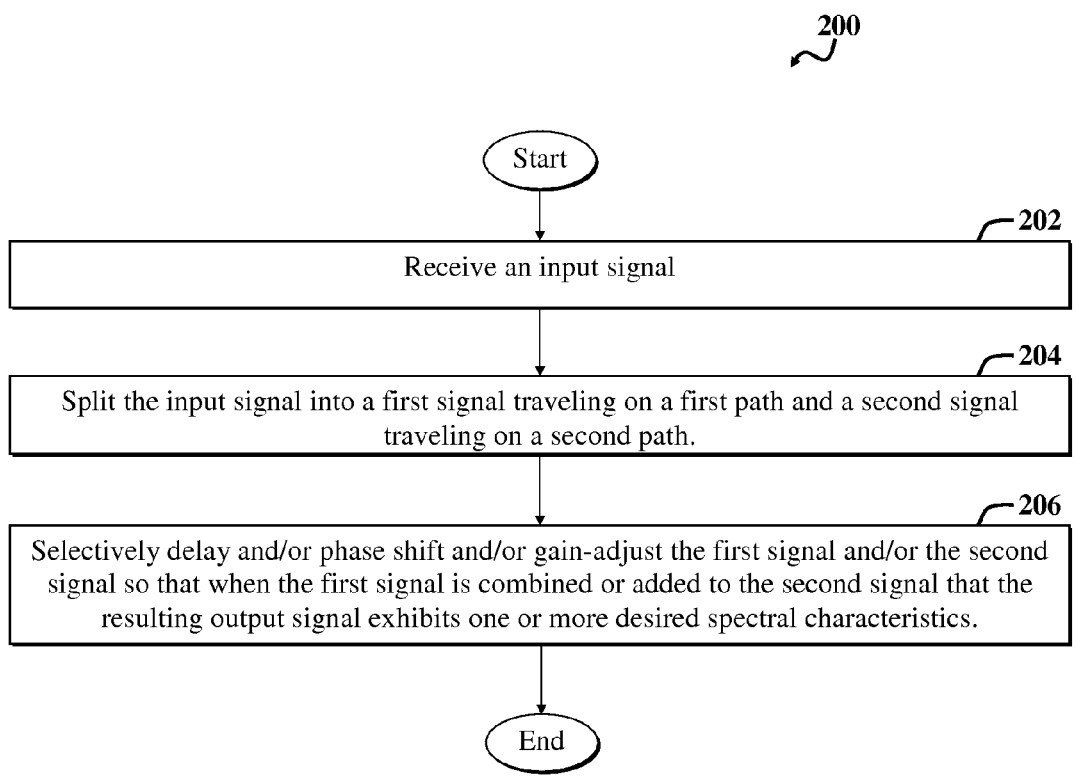
FIG. 11 is a flow diagram of a second example method implemented via the selective spectrum self-canceler filters of FIGS. 1-4.

FIG. 11 is a flow diagram of a second example method 200 implemented via the selective spectrum self-canceler filters 10 of FIGS. 1-4.

The method 200 includes a first step 202, which includes receiving an input signal.

A second step 204 includes splitting the input signal onto a first path and a second path.

A third step 206 includes selectively delaying and/or phase shifting and/or adjusting the gain (also called gain-adjusting) of a signal on the first path and/or the second path so that when signals on the first path and second path are combined, the resulting output signal exhibits desired spectral characteristics.

Figure 12:
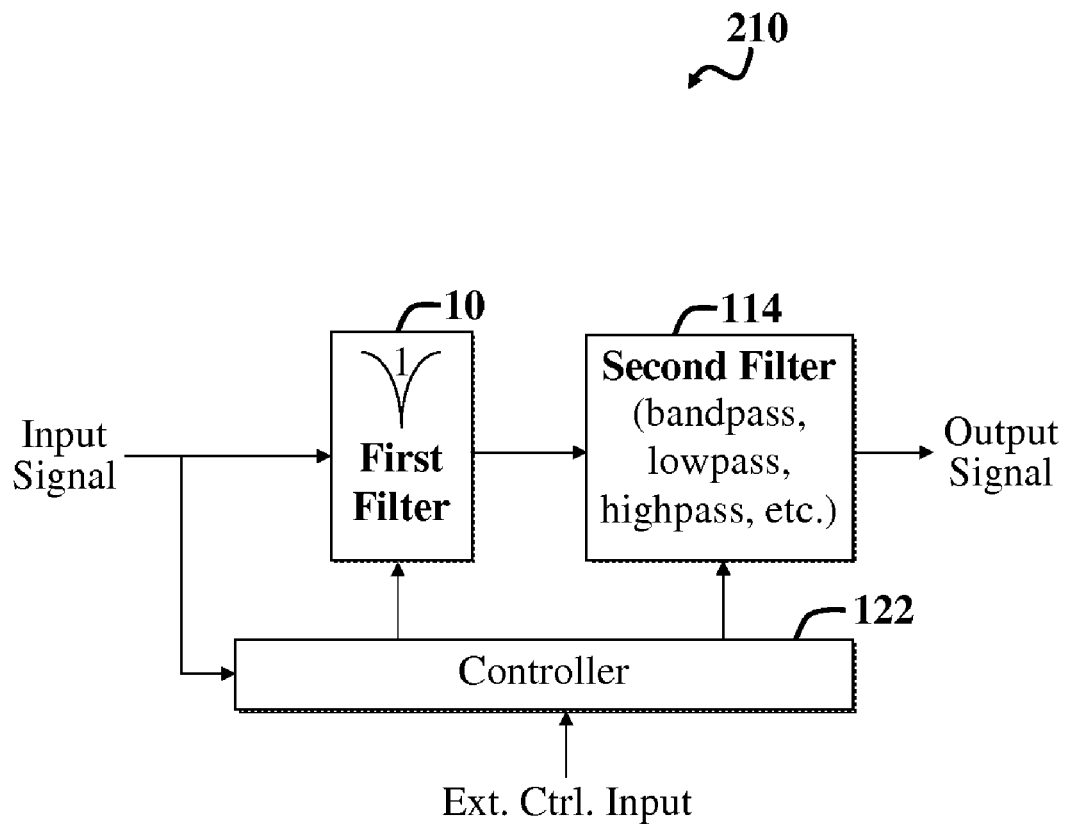
FIG. 12 is a diagram of a simplified fifth example adjustable filter incorporating an instance of the first example selective spectrum self-canceler filter of FIGS. 1-2 and adapted to implement the method of FIG. 11.

FIG. 12 is a diagram of a simplified fifth example combined adjustable filter 210 incorporating an instance of the first example selective spectrum self-canceler filter 10 of FIGS. 1-2 and adapted to implement the method of FIG. 11.

The adjustable filter 210 represents a combined filter that includes a first notch filter 10 and a second filter 114, both of which are optionally controllable via the controller 122.

With reference to FIGS. 1, 2 and 12, the first filter 10 represents an example adjustable filter that includes a first mechanism 12 for receiving a first signal. A second mechanism 18, 20 employs one or more modified representations of the first signal to cancel, suppress, or reduce one or more frequency components of the first signal, yielding an output signal in response thereto. The first mechanism 12 includes a splitter 12 for receiving the first signal and splitting the first signal onto a first path 14 and a second path 16. The second mechanism 18, 20 further includes one or more delay modules 30 and one or more phase shifters 32 in the first path 14 and/or the second path 16. One or more controllable amplifiers 34 are optionally included in the first path 14 and/or the second path 16.

The second filter 114 may be implemented via a bandpass, lowpass, allpass, high pass, notch filter, or other suitable filter or combination of filters. Furthermore, note that the second filter 114 may be included before the first filter 10. Furthermore, while the second filter 114 is shown as a single module, the second filter 114 may be implemented as plural filters positioned at different locations within the overall adjustable filter 210. For example, a first portion of the second filter 114 may be included before the first filter 10, while a second portion of the second filter 114 may be included after the first filter 10 without departing from the scope of the present teachings.

The exact choice of the second filter 114 is application specific and depends on the desired frequency response of the overall adjustable filter 210. For example, the second filter 114 may include a bandpass filter and an additional notch filter. In this example, the resulting combined filter 210 may exhibit the example asymmetrical frequency response 140 of FIG. 7, or the combined filter 210 may exhibit another frequency response, such as the response 170 of FIG. 9 or the response 160 of FIG. 8.

The controller 122 may include instructions for calibrating the combined filter 210 to yield a combined desired transfer function or frequency response based on one or more predetermined inputs, such as a temperature input, to the controller 122.

Figure 13:
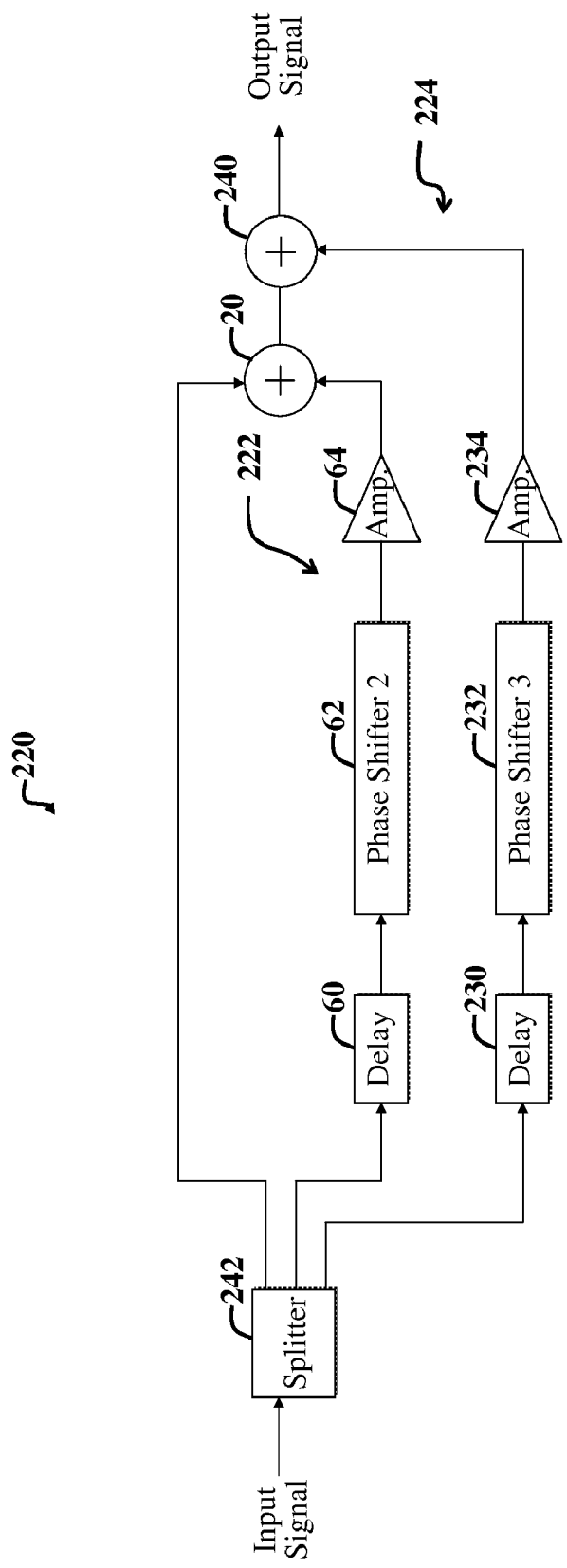
FIG. 13 is a diagram of a sixth example adjustable filter incorporating nested instances of an adjustable selective spectrum self-canceler filter.

FIG. 13 is a diagram of a sixth example adjustable filter 220 incorporating nested instances 222, 224 of an adjustable selective spectrum self-canceler filter. A first instance 222 includes the delay module 60, phase shifter 62, amplifier 64, and first adder 20 on a second path and includes a first path from the splitter 242 directly to the first adder 20. A second instance 224 includes another delay 230, phase shifter 232, and amplifier 234, and second adder 240. A three-way input splitter 242 splits the input signal onto three separate paths, including a first path directly to the first adder 20, a second path, which includes components of the first instance 222, and a third path, which includes components of the second instance 224.

The operation of the sixth adjustable filter 220 in FIG. 13 may be similar to the operation of the adjustable filter 10 of FIG. 1 with the exception that the second filter instance 224 acts to further adjust the output of the first adder 20 by selectively combining the output thereof with another delayed, shifted, and amplified version of the input signal to the splitter 242 via the second adder 240.

Note that the first adder 20 and the second adder 240 may be combined into a single adder without departing from the scope of the present teachings. Furthermore, one or more components of the first instance 222 on the second path or the second instance 224 on the third path may be moved to the first path, i.e., upper path.

Although embodiments of the invention are discussed primarily with respect to analog filters for reducing or suppressing undesirable signal components in a signal environment, embodiments of the invention are not limited thereto. For example, filters discussed herein may be digital filters or hybrid digital and analog filters. Furthermore, such filters may be applicable to other fields, such as use in feedback control of dynamic systems.

Arrowheads shown on signal paths between various modules are for illustrative purposes only. For example, various communication paths or connecting lines, which appear to be unidirectional in the drawings, may be bidirectional without departing from the scope of the present invention.

Although a process of embodiments discussed herein may be presented as a single entity, such as software or hardware executing on a single machine, such software can readily be executed on multiple machines. That is, there may be multiple instances of a given software program, a single program may be executing on two or more processors in a distributed processing environment, parts of a single program may be executing on different physical machines, etc. Furthermore, two different programs, such as a convergence algorithm, a controller, and a noise-pattern analyzer can be executing in a single module, or in different modules.

Although the invention has been discussed with respect to specific example embodiments thereof, these embodiments are merely illustrative, and not restrictive, of the invention. In the description herein, numerous specific details are provided, such as examples of components and/or methods, to provide a thorough understanding of discussed example embodiments. One skilled in the relevant art will recognize, however, that certain embodiments can be practiced without one or more of the specific details, or with other apparatus, systems, assemblies, methods, components, materials, parts, and/or the like. In other instances, well-known structures, materials, or operations are not specifically shown or described in detail to avoid obscuring aspects of the example embodiments discussed herein.

A "machine-readable medium" or "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. A computer may be any processor in communication with a memory.

Reference throughout this specification to "one embodiment", "an example embodiment", and "illustrative embodiment", or "a specific embodiment" means that a particular feature, structure, or characteristic described in connection with the embodiment not necessarily included in all possible example embodiments. Thus, respective appearances of the phrases "in one embodiment", "in an embodiment", "illustrative embodiment", or "in a specific embodiment" in various places throughout this specification are not necessarily referring to the same embodiment. Furthermore, the particular features, structures, or characteristics of any specific embodiment or example embodiment discussed herein may be combined in any suitable manner with one or more other embodiments. It is to be understood that other variations and modifications of the embodiments described and illustrated herein are possible in light of the teachings herein, and the variations are to be considered as part of the spirit and scope of the present invention.

Example embodiments discussed herein may be implemented in whole or in part by using a programmed general purpose digital computer; by using application specific integrated circuits, programmable logic devices, optical, chemical, biological, quantum or nanoengineered systems or mechanisms; and so on. In general, the functions of various embodiments can be achieved by any means as is known in the art. Distributed or networked systems, components, and/or circuits can be used. Communication, or transfer of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

As used in the description herein and throughout the claims that follow "a", "an", and "the" include plural references unless the context clearly dictates otherwise. Furthermore, as used in the description herein and throughout the claims that follow, the meaning of "in" includes "in" and "on" unless the context clearly dictates otherwise.

The foregoing description of illustrated example embodiments, including what is described in the Abstract, is not intended to be exhaustive or to limit the invention to the precise forms disclosed herein. While certain example embodiments are described herein for illustrative purposes only, various equivalent modifications are possible within the spirit and scope of the present invention, as those skilled in the relevant art will recognize and appreciate. As indicated, these modifications may be made in light of the foregoing description of illustrated example embodiments and are to be included within the spirit and scope of the present invention.

Thus, while example embodiments have been described herein, a latitude of modification, various changes and substitutions are intended in the foregoing disclosures, and it will be appreciated that in some instances some features of embodiments will be employed without a corresponding use of other features without departing from the scope and spirit of the invention. Therefore, many modifications may be made to adapt a particular situation or material to the essential scope and spirit of the present invention. It is intended that the invention not be limited to the particular terms used in following claims and/or to a particular embodiment disclosed as the best mode contemplated for carrying out this invention, but that the invention will include any and all embodiments and equivalents falling within the scope of the appended claims.

What is claimed is:

1. A filter comprising:
    first means for receiving a first signal; and
    second means for employing one or more modified representations of the first signal to suppress one or more frequency components of the first signal, yielding an output signal in response thereto,
    wherein the first means includes a splitter adapted to receive the first signal and split the first signal onto a first path and a second path, and
    wherein the second means includes one or more delay modules and one or more phase shifters in the first path and/or the second path.

2. The filter of claim 1, further including one or more amplifiers in the first path or the second path.

3. The filter of claim 2, wherein one or more of the one or more delay modules, phase shifters, or amplifiers are responsive to one or more control signals from a controller.

4. The filter of claim 3, wherein the controller is adapted to modify behavior of the second means so that the filter is characterized by a desired frequency response.

5. A filter comprising:
    first means for receiving a first signal; and
    second means for employing one or more modified representations of the first signal to suppress one or more frequency components of the first signal, yielding an output signal in response thereto,
    wherein the filter implements a controllable notch filter, the controllable notch filter being controllable in part via one or more controllable Variable Gain Amplifiers (VGAs) included in the second means, the one or more controllable VGAs affecting alignment of a modified representation of the first signal relative to the first signal itself.

6. The filter of claim 5, wherein the second means includes third means for combining the modified representation of the first signal with the first signal to yield an output signal, wherein the output signal is representative of the first signal with certain frequency components thereof cancelled or suppressed.

7. The filter of claim 5, wherein one or more instances of the notch filter are implemented in a combined filter that includes a second filter.

8. The filter of claim 7, wherein a transfer function or frequency response of the combined filter is characterized by an asymmetrical frequency response curve.

9. The filter of claim 7, wherein the second filter includes a bandpass filter.

10. The filter of claim 9, further including a controller in communication with the one or more instances of the notch filter.

11. The filter of claim 10, wherein the controller includes instructions for calibrating the combined filter to yield a combined desired transfer function based on one or more predetermined inputs to the controller.

12. The filter of claim 11, wherein the one or more predetermined inputs include temperature.

13. A filter comprising:
a first circuit that is operative to receive a first signal and that comprises a splitter, the splitter operative to split the first signal onto a first path and a second path; and
a second circuit employing one or more modified representations of the first signal to suppress one or more frequency components of the first signal, yielding an output signal in response thereto, wherein the second circuit comprises at least one delay module and at least one phase shifter in the first path and/or the second path.

14. The filter of claim 13, wherein the first path comprises an amplifier.

15. The filter of claim 13, wherein the first path comprises an amplifier that is responsive to a control signal from a controller.

16. The filter of claim 13, wherein the second path comprises an amplifier.

17. The filter of claim 13, wherein the second path comprises an amplifier that is responsive to a control signal from a controller.

18. The filter of claim 13, wherein the first path comprises a first amplifier and the second path comprises a second amplifier.

19. The filter of claim 13, wherein the at least one phase shifter is responsive to a control signal from a controller.

20. The filter of claim 13, wherein the at least one delay module is responsive to a control signal from a controller.

21. The filter of claim 13, wherein the filter is connected to a controller that is operative to modify behavior of the second circuit so that the filter is characterized by a desired frequency response.

22. The filter of claim 13, wherein the filter implements a controllable notch filter.

23. The filter of claim 13, wherein the filter comprises a controllable notch filter that is controllable via one or more controllable Variable Gain Amplifiers (VGAs).

24. The filter of claim 13, wherein the filter is controllable by a Variable Gain Amplifier (VGA) that affects alignment of a modified representation of the first signal relative to the first signal.

25. A filter comprising:
a first circuit that is operative to receive a first signal; and
a second circuit that employs at least one modified representation of the first signal to suppress at least one frequency component of the first signal, yielding an output signal in response thereto,
wherein the filter implements a controllable notch filter, the controllable notch filter being controllable at least in part by at least one controllable variable gain amplifier that is included in the second circuit and that affects alignment of a modified representation of the first signal relative to the first signal itself.

26. The filter of claim 25, wherein the second circuit is operative to combine the modified representation of the first signal with the first signal to yield an output signal, wherein the output signal is representative of the first signal with a frequency component thereof cancelled or suppressed.

27. The filter of claim 25, wherein one or more instances of the notch filter are implemented in a combined filter that includes a second filter.

28. The filter of claim 25, wherein the notch filter comprises a combined filter.

29. The filter of claim 25, wherein the notch filter comprises a combined filter having a transfer function or frequency response that is characterized by an asymmetrical frequency response curve.

30. The filter of claim 25, wherein the notch filter has a transfer function or frequency response characterized by an asymmetrical frequency response curve.

31. The filter of claim 25, wherein the notch filter is implemented in a combined filter that comprises a bandpass filter.

32. The filter of claim 25, wherein the filter is connected to a controller that is operative to modify behavior of the second circuit so that the filter is characterized by a desired frequency response.

33. The filter of claim 25, further including a controller in communication with the one or more instances of the notch filter.

34. The filter of claim 25, further including a controller that comprises calibration instructions.

35. The filter of claim 25, further including a controller that has temperature as an input.

* * * * *